United States Patent
Raisanen

(10) Patent No.: US 8,071,452 B2
(45) Date of Patent: Dec. 6, 2011

(54) ATOMIC LAYER DEPOSITION OF HAFNIUM LANTHANUM OXIDES

(75) Inventor: Petri I. Raisanen, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 354 days.

(21) Appl. No.: 12/430,751

(22) Filed: Apr. 27, 2009

(65) Prior Publication Data

US 2010/0270626 A1  Oct. 28, 2010

(51) Int. Cl.
*H01L 21/336* (2006.01)

(52) U.S. Cl. .................... 438/287; 438/643; 438/3

(58) Field of Classification Search .................. 438/287, 438/643, 3, 618, 624, 642, 653
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 5,855,680 A | 1/1999 | Soininen et al. | |
| 6,013,553 A | 1/2000 | Wallace | |
| 6,287,965 B1 | 9/2001 | Kang et al. | |
| 6,342,427 B1 | 1/2002 | Choi et al. | |
| 6,420,279 B1 | 7/2002 | Ono et al. | |
| 6,590,251 B2 | 7/2003 | Kang et al. | |
| 6,627,503 B2 | 9/2003 | Ma et al. | |
| 6,734,090 B2 | 5/2004 | Agarwala et al. | |
| 6,820,570 B2 | 11/2004 | Kilpela et al. | |
| 6,824,665 B2 | 11/2004 | Shelnut et al. | |
| 6,858,547 B2 | 2/2005 | Metzner | |
| 6,875,677 B1 | 4/2005 | Conley, Jr. et al. | |
| 6,930,059 B2 | 8/2005 | Conley, Jr. et al. | |
| 7,045,430 B2 * | 5/2006 | Ahn et al. | 438/287 |
| 7,053,009 B2 | 5/2006 | Conley, Jr. et al. | |
| 7,071,051 B1 | 7/2006 | Jeon et al. | |
| 7,129,165 B2 | 10/2006 | Basol et al. | |
| 7,132,360 B2 | 11/2006 | Schaeffer et al. | |
| 7,135,421 B2 | 11/2006 | Ahn et al. | |
| 7,147,766 B2 | 12/2006 | Uzoh et al. | |
| 7,172,497 B2 | 2/2007 | Basol et al. | |
| 7,192,824 B2 | 3/2007 | Ahn et al. | |
| 7,192,892 B2 | 3/2007 | Ahn et al. | |
| 7,205,247 B2 | 4/2007 | Lee et al. | |
| 7,235,501 B2 | 6/2007 | Ahn et al. | |
| 7,312,494 B2 | 12/2007 | Ahn et al. | |

(Continued)

OTHER PUBLICATIONS

Chang et al.; Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.

(Continued)

*Primary Examiner* — Zandra Smith
*Assistant Examiner* — Telly Green
(74) *Attorney, Agent, or Firm* — David E. Rogers; Damon Boyd; Snell & Wilmer LLP

(57) ABSTRACT

There is provided an improved method for depositing thin films using precursors to deposit binary oxides by atomic layer deposition (ALD) techniques. Also disclosed is an ALD method for depositing a high-k dielectric such as hafnium lanthanum oxide (HfLaO) on a substrate. Embodiments of the present invention utilize a combination of ALD precursor elements and cycles to deposit a film with desired physical and electrical characteristics. Electronic components and systems that integrate devices fabricated with methods consistent with the present invention are also disclosed.

47 Claims, 6 Drawing Sheets

U.S. PATENT DOCUMENTS

| | | | |
|---|---|---|---|
| 7,393,736 | B2 | 7/2008 | Ahn et al. |
| 7,402,534 | B2 | 7/2008 | Mahajani |
| 7,405,166 | B2 | 7/2008 | Liang et al. |
| 7,405,454 | B2 | 7/2008 | Ahn et al. |
| 7,414,281 | B1 | 8/2008 | Fastow |
| 2002/0001974 | A1 | 1/2002 | Chan |
| 2002/0064592 | A1 | 5/2002 | Datta et al. |
| 2002/0172768 | A1 | 11/2002 | Endo et al. |
| 2004/0144980 | A1 | 7/2004 | Ahn et al. |
| 2004/0168627 | A1 | 9/2004 | Conley et al. |
| 2004/0198069 | A1 | 10/2004 | Metzner et al. |
| 2005/0023624 | A1 | 2/2005 | Ahn et al. |
| 2005/0070123 | A1 | 3/2005 | Hirano |
| 2005/0110069 | A1 | 5/2005 | Kil et al. |
| 2005/0214458 | A1 | 9/2005 | Meiere |
| 2005/0218462 | A1 | 10/2005 | Ahn et al. |
| 2005/0271813 | A1 | 12/2005 | Kher et al. |
| 2006/0013946 | A1 | 1/2006 | Park et al. |
| 2006/0019033 | A1 | 1/2006 | Muthukrishnan et al. |
| 2006/0051925 | A1 | 3/2006 | Ahn et al. |
| 2006/0060930 | A1 | 3/2006 | Metz et al. |
| 2006/0062910 | A1 | 3/2006 | Meiere |
| 2006/0113675 | A1 | 6/2006 | Chang et al. |
| 2006/0128168 | A1 | 6/2006 | Ahn et al. |
| 2006/0148180 | A1 | 7/2006 | Ahn et al. |
| 2006/0193979 | A1 | 8/2006 | Meiere et al. |
| 2006/0208215 | A1 | 9/2006 | Metzner et al. |
| 2006/0223301 | A1 | 10/2006 | Vanhaelemeersch et al. |
| 2006/0228888 | A1 | 10/2006 | Lee et al. |
| 2006/0257563 | A1 | 11/2006 | Doh et al. |
| 2006/0258078 | A1 | 11/2006 | Lee et al. |
| 2006/0266289 | A1 | 11/2006 | Verghese et al. |
| 2007/0031599 | A1 | 2/2007 | Gschwandtner et al. |
| 2007/0037412 | A1 | 2/2007 | Dip et al. |
| 2007/0059948 | A1 | 3/2007 | Metzner et al. |
| 2007/0065578 | A1 | 3/2007 | McDougall |
| 2007/0066010 | A1 | 3/2007 | Ando |
| 2007/0134942 | A1 | 6/2007 | Ahn et al. |
| 2007/0232501 | A1 | 10/2007 | Tonomura |
| 2007/0252244 | A1 | 11/2007 | Srividya et al. |
| 2008/0054332 | A1 | 3/2008 | Kim et al. |
| 2008/0057659 | A1 | 3/2008 | Forbes et al. |
| 2008/0124908 | A1 | 5/2008 | Forbes et al. |
| 2008/0176375 | A1 | 7/2008 | Erben et al. |
| 2008/0224240 | A1 | 9/2008 | Ahn et al. |
| 2008/0233288 | A1 | 9/2008 | Clark |
| 2008/0261413 | A1 | 10/2008 | Mahajani |
| 2008/0282970 | A1 | 11/2008 | Heys et al. |
| 2009/0011608 | A1 | 1/2009 | Nabatame |

OTHER PUBLICATIONS

USPTO; Office Action dated Feb. 15, 2011 in U.S. Appl. No. 12/118,596.

PCT; International Search report and Written Opinion dated Nov. 12, 2010 in Application No. PCT/US2010/030126.

PCT; International Search report and Written Opinion dated Jan. 12, 2011 in Application No. PCT/US2010/045368.

Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.

* cited by examiner

ATOMIC LAYER DEPOSITION OF HAFNIUM LANTHANUM OXIDES

DESCRIPTION OF THE INVENTION

1. Field of the Invention

The present invention relates to thin film deposition, and more particularly methods using precursors to deposit hafnium lanthanum oxides by atomic layer deposition and components incorporating hafnium lanthanum oxide dielectric layers formed by methods consistent with the invention.

2. Background of the Invention

For many years, silicon dioxide ($SiO_2$) has been used in semiconductor substrates for components such as transistor gate dielectrics and capacitor dielectrics. However, as circuit components have reduced in size, the electrical performance characteristics of $SiO_2$ result in undesirable effects such as increased leakage current. Controlling leakage current to maintain high speed and low power performance presents a challenge when older-generation dielectrics such as $SiO_2$ are used in the fabrication of newer integrated circuit geometries.

Newer processes, especially those that use fabrication geometries less than 65 nm have begun to include high dielectric constant ("high-k") insulators in semiconductor fabrication. Some chipmakers now rely on high-k dielectrics, especially for 45 nm and smaller process geometries. Replacing $SiO_2$ gate dielectrics with high-k dielectrics is important to achieve smaller device geometries while controlling leakage and other electrical performance criteria.

While the use of high-k dielectrics allows for smaller scaling of integrated circuit components such as transistor gate dielectrics, new performance issues arise from their use. For example, when conventional gate electrodes are paired with a high-k dielectric such as $HfO_2$, problems such as low yield and poor threshold voltage ($V_t$) control must be addressed.

Research has been conducted regarding the benefits of using ternary oxides in high-k dielectric applications. Specifically, films manufactured from hafnium lanthanum oxides (HfLaO) show promise in providing high dielectric constant values, reduced crystallization temperatures, improved yield, and better threshold voltage ($V_t$) control as compared to other high-k dielectrics such as $HfO_2$. Furthermore, unlike other Hf-based amorphous materials such as HfSiOx or HfAlOx, the permittivity of HfLaO retains a high value (>20). Thus HfLaO dielectrics are desirable in terms of electrical performance criteria, but time- and cost-effective fabrication of HfLaO dielectrics on substrates creates challenges.

A wide variety of methods and related apparatus exist to provide a thin film on a substrate such as a semiconductor. Some methods form a thin film on a substrate by utilizing a surface reaction on the semiconductor, such as vacuum evaporation deposition, molecular beam epitaxy, different variants of Chemical Vapor Deposition (CVD) (including low-pressure CVD, organometallic CVD and plasma-enhanced CVD) and Atomic Layer Epitaxy (ALE). ALE is also referred to as Atomic Layer Deposition (ALD).

ALD is a method of depositing thin films on a surface of a substrate through the sequential introduction of various precursor species. A conventional ALD apparatus may include a reactor chamber, a substrate holder, a gas flow system including gas inlets for providing precursors and reactants to a substrate surface and an exhaust system for removing used gases. The growth mechanism relies on the adsorption of a precursor on the active sites of the substrate and conditions are preferably maintained such that no more than a monolayer forms on the substrate, thereby self-terminating the process. Exposing the substrate to a first precursor is usually followed by a purging stage or other removal process (e.g., an evacuation or "pump down") wherein any excess amounts of the first precursor as well as any reaction by-products are removed from the reaction chamber. The second reactant or precursor is then introduced into the reaction chamber at which time it reacts with the first precursor, and this reaction creates the desired thin film on the substrate. The reaction terminates when all of the available first precursor species adsorbed on the substrate has been reacted with the second precursor. A second purge or other removal stage is then performed which rids the reaction chamber of any remaining second precursor and possible reaction by-products. This cycle can be repeated to grow the film to a desired thickness.

One of the recognized advantages of ALD over other deposition processes is that it is self-saturating and uniform, as long as the temperature is within the ALD window (which is above the condensation temperature and below the thermal decomposition temperature of the reactants) and sufficient reactant is provided to saturate the surface in each pulse. Thus, neither temperature nor gas supply needs to be perfectly uniform in order to obtain uniform deposition.

ALD is further described in Finnish patent publications 52,359 and 57,975 and in U.S. Pat. Nos. 4,058,430 and 4,389,973. Apparatus for implementing these methods are disclosed in U.S. Pat. Nos. 5,855,680, 6,511,539, and 6,820,570, Finnish Patent No. 100,409, Material Science Report 4(7)(1989), p. 261, and Tyhjiotekniikka (Finnish publication for vacuum techniques), ISBN 951-794-422-5, pp. 253-261.

Different film materials have been deposited employing ALD. Known materials for use in ALD include binary oxides such as $Al_2O_3$, $HfO_2$, $ZrO_2$, $La_2O_3$ and $Ta_2O_5$. Various ternary oxides are also well known materials for use in ALD and include HfZrO, HfAlO and HfLaO. As discussed previously, selection of the appropriate material for use in high-k dielectric applications requires consideration of the impact of the deposited substance on the particular substrate and circuit environment. In the case of ALD of HfLaO, a known Hf-precursor is $HfCl_4$ and a known La-precursor is $La(THD)_3$. Due to the hygroscopic nature of $La_2O_3$, ozone ($O_3$) is often used instead of $H_2O$ as an oxidant in prior art processes, but unfortunately, both the $HfCl_4/O_3$ process and the $La(THD)/O_3$ process are highly sensitive to even small changes in the ozone present. Accordingly, achieving a repeatable process is difficult with prior ALD processes. Moreover, the chlorine chemistry inherent in known in prior ALD processes in combination of with $La(THD)_3$ can cause problems such as delamination.

The design of thin film deposition processes frequently involves the consideration of two important factors: minimization of the precursor pulse time and maximization of the amount of deposition per cycle. In prior approaches, the amount of pulse time needed for the application of a particular precursor could be adjusted in part by selecting an appropriate temperature range for the substrate, precursor, and reactor chamber. In general, higher precursor temperatures provide for higher vapor pressures and therefore could result in improved deposition and reaction of precursors in the substrate monolayer, which leads in turn to shorter pulse cycle times. However, temperatures in the ALD process are restricted by the physical properties of the precursors being used, i.e., low reaction temperatures increase the risk of condensation on the substrate (rather than having desired chemisorption) and reaction temperatures that are too high cause undesired degradation of the precursor material. Further, lower reaction temperatures for some known chemistries may lead to the deposition of undesirable reaction byproducts such as chlorine residues.

Thus, a need exists for a method for depositing a high-k dielectric film on a substrate using low temperatures with reduced impurities, preferably with reduced pulse times and improved throughput times.

SUMMARY OF THE INVENTION

The invention includes an ALD method for depositing a high-k dielectric such as hafnium lanthanum oxide (HfLaO) on a substrate. Embodiments of the present invention utilize a combination of ALD precursor constituents and cycles to deposit a film with desired physical and electrical characteristics. The invention also includes electronic components and systems that integrate devices fabricated with methods consistent with the present invention.

As used herein, "substrate" refers to any surface upon which film processing is performed. For example, a substrate on which processing can be performed, can be comprised of materials such as silicon, silicon oxide, silicon on insulator (SOI), carbon doped silicon oxides, silicon nitride, doped silicon, germanium, gallium arsenide, glass, sapphire, or any other suitable materials such as metals, metal nitrides, metal alloys, or other conductive materials, printed organic or inorganic circuit boards, or thin-film ceramic substrates, depending on the application. In a preferred embodiment, the substrate comprises a semiconductor. Barrier layers, metals or metal nitrides on a substrate surface include titanium, titanium nitride, tungsten nitride, tantalum and tantalum nitride. Substrates may have any desired dimensions, such as 200 mm or 300 mm diameter wafers, and may also take the form of rectangular or square panels.

As used herein, "pulse" refers to an introduction of a quantity of a compound that is intermittently or non-continuously introduced into a reaction zone of a reaction chamber. The quantity of a particular compound within each pulse may vary over time, depending on the duration of the pulse. As more fully explained below, the duration of each pulse is selected depending upon a number of factors such as, for example, the volume capacity of the process chamber employed, the vacuum system coupled thereto, and the volatility/reactivity of the particular compound itself.

In one embodiment, a method is provided for depositing a film on a substrate. The method comprises the steps of providing a substrate within a reaction chamber; applying an ALD cycle to the substrate, where the cycle comprises exposing the substrate to a first precursor gas pulse sequence (sometimes referred to herein as a "first sequence"), and a second precursor gas pulse sequence (sometimes referred to herein as a "second sequence").

The first sequence includes (i) exposing the substrate to a first precursor gas for a first precursor pulse interval then removing the first precursor gas thereafter, and (2) exposing the substrate to a first oxidant gas for a first oxidation pulse interval then removing the first oxidation gas thereafter. The second sequence includes (i) exposing the substrate to a second precursor gas for a second precursor pulse interval then removing the second precursor gas thereafter, and (ii) exposing the substrate to a second oxidant gas for a second oxidation pulse interval then removing the second oxidation gas thereafter. In various embodiments, the first precursor gas and the second precursor gas respectively comprise at least one of tetrakis-ethyl-methylamino hafnium (TEMAHf) and Lanthanum tris-formamidinate (LaFAMD)$_3$.

In one embodiment, the first precursor gas comprises TEMAHf and the second precursor gas comprises (LaFAMD)$_3$. Various oxidants may be used in embodiments of the present invention, and in one embodiment, the first oxidant gas and the second oxidant gas comprise at least one of oxygen ($O_2$), ozone ($O_3$), atomic-oxygen (O), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), derivatives thereof or combinations thereof, and in a preferred embodiment, the first oxidant gas and the second oxidant gas comprise a mixture of $O_2$ and $O_3$. Any desired ratio of oxygen and ozone may be utilized in any oxidant step, such as a mixture of $O_2$ and $O_3$ comprising approximately 10 atomic percent to 20 atomic percent $O_3$. In preferred embodiments, the mixture of $O_2$ and $O_3$ in the oxidizer step comprises approximately 12 atomic percent to 18 atomic percent $O_3$.

The ALD cycle may be repeated any number of times to achieve any desired goal such as a predetermined layer thickness. The number of iterations of precursor sequences per ALD cycle may also vary, as may the ratio of the number of first precursor gas sequences performed versus the number of second precursor gas sequences performed per ALD cycle. In one embodiment, the predetermined plurality of times that each precursor sequence is performed is determined by a predetermined ratio of hafnium to lanthanum to be deposited, or by a predetermined dielectric constant of the film to be deposited on the substrate, or by an index of refraction of the deposited film, or by a particular desired molecular composition of the deposited film, or a combination of factors.

In one embodiment, for each ALD cycle, one second precursor gas sequence is performed for each first precursor gas sequence. In other embodiments, more first precursor gas sequences are performed than second precursor gas sequences in a particular ALD cycle. In yet other embodiments, more second precursor gas sequences are performed than first precursor gas sequences in a particular ALD cycle. A ratio of first precursor sequences to second precursor sequences (which may be called a "pulse ratio") may be determined based upon any desired characteristic of the film to be deposited, and the number of first and second precursor gas sequences may be accordingly performed in each ALD cycle. In yet another embodiment, the pulse ratio may vary from one ALD cycle to another ALD cycle, depending on desired changes to the deposited film, and such changes may occur, for example, on measured or observed characteristics of the film being deposited.

The pulse interval for exposure of various gasses to the substrate may be chosen to satisfy any desired process criterion, such as deposited layer growth rate or cycle throughput time. In one embodiment, the first precursor pulse interval is in the range of 300 milliseconds to 5 seconds; the first oxidation pulse interval is in the range of 50 milliseconds to 10 seconds; the second precursor pulse interval is in the range of 500 ms to 10 seconds; and the first oxidation pulse interval is in the range of 50 milliseconds to 10 seconds. In a preferred embodiment, the first precursor pulse interval is in the range of 1 second to 2 seconds; the first oxidation pulse interval is in the range of 50 milliseconds to 2 seconds; the second precursor pulse interval is in the range of 1 second to 4 seconds; and the first oxidation pulse interval is in the range of 50 milliseconds to 2 seconds.

In one embodiment, the first precursor gas sequence deposits on the substrate a film to achieve a film thickness range of 0.8-1.1 Å per first precursor gas sequence, and the second precursor gas sequence deposits on the substrate a film to achieve a film thickness range of 0.6-0.8 Å per second precursor gas sequence. A predetermined amount of film growth may be deposited by any particular ALD cycle, for example, in one embodiment the atomic layer deposition cycle deposits on the substrate a film to achieve a film thickness range of 1.4-2.7 Å per deposition cycle—such thickness ranges may occur in embodiments of the present invention for ALD cycles that perform a single first precursor gas sequence and a single second precursor gas sequence per ALD cycle.

The substrate, reaction chamber, and precursor/oxidant vessels may be maintained at various temperatures to provide reactions at a desired rate and with desired physical and electrical characteristics. Embodiments of the present invention minimize utilize low deposition temperatures to minimize crystallization and thereby result in amorphous deposited films. In one embodiment, during the ALD cycle, the substrate is maintained at a temperature in the range of 140° C. to 300° C. In another embodiment, a vessel temperature, for example a temperature of a vessel that at least temporarily stores a precursor gas or oxidant, may be maintained at a temperature in the range of approximately 135° C. to 145° C. In a preferred embodiment, during the ALD cycle, the substrate is maintained at a temperature in the range of 175° C. to 250° C.

Gasses and reaction byproducts may be removed from the reaction chamber using any desired technique. In one instance, the method of removing one or more of the first precursor gas, the first oxidation gas, the second precursor gas and the second oxidation gas comprises introducing a purge gas into the reaction chamber for a predetermined purge period, wherein the purge gas comprises at least one of argon, nitrogen, helium, hydrogen, forming gas, krypton, and xenon; and the purge period may be selected to be in the range of approximately 3 seconds to 10 seconds. In an alternative embodiment, the purge period is within the range of 500 milliseconds to four seconds. In one implementation, the method of removing one or more of the first precursor gas, the first oxidation gas, the second precursor gas and the second oxidation gas could comprise evacuating gas from the reaction chamber for a predetermined evacuation period.

Electronic devices may be fabricated by methods consistent with the present invention. Such devices include capacitors, transistors, a FLASH memory cells, and a DRAM memory cells, whether created as discrete components or formed within a semiconductor or other substrate. The electronic devices may comprise an HfLaO dielectric layer and a conductive layer in communication with the dielectric layer, the dielectric layer being deposited in a film by applying an ALD cycle to the substrate in the manner described herein.

It is to be understood that the descriptions of this invention herein are exemplary and explanatory only and are not restrictive of the invention as claimed.

DESCRIPTION OF THE PREFERRED EMBODIMENTS

Reference will now be made in detail to the present exemplary embodiments of the invention, examples of which are illustrated in the accompanying drawings.

Embodiments of the invention provide methods for preparing thin films used in a variety of applications, especially for high-k dielectric materials and barrier materials used in transistor, capacitor, and memory cell fabrication. The methods include the use of an atomic layer deposition (ALD) process to deposit a hafnium lanthanum oxide (HfLaO) film layer on a substrate. By use of particular precursors, embodiments of the claimed method create thicker HfLaO films in less time than prior art processes, and may use a lower reaction temperature with shorter precursor and reactant pulse and purge times. In an embodiment, an ALD process may be used to control elemental composition of the deposited materials, by techniques such as controlling the ratio of lanthanum to hafnium deposited on the substrate, thereby achieving desired film performance characteristics such as improved leakage current.

The material deposited in a film during ALD deposition may be any desired material such as a dielectric material, a barrier material, a conductive material, a nucleation/seed material or an adhesion material. In one embodiment, the deposited material may be a dielectric material containing oxygen and at least one additional element, such as lanthanum, hafnium, silicon, tantalum, titanium, aluminum, zirconium, or combinations thereof, and in a preferred embodiment, the deposited material comprises hafnium lanthanum oxide (HfLaO). In additional embodiments, the dielectric material may contain hafnium oxide, zirconium oxide, tantalum oxide, aluminum oxide, lanthanum oxide, titanium oxide, silicon oxide, silicon nitride, oxynitrides thereof (e.g., $HfO_xN_y$), silicates thereof (e.g., $HfSi_xO_y$), aluminates thereof (e.g., $HfAl_xO_y$), silicon oxynitrides thereof (e.g., $HfSi_xO_yN_z$), and combinations thereof. The dielectric material may also contain multiple layers of varying compositions. For example, a laminate film may be formed by depositing a silicon oxide layer onto a hafnium lanthanum oxide layer to form a hafnium lanthanum silicate material.

Figure 1:
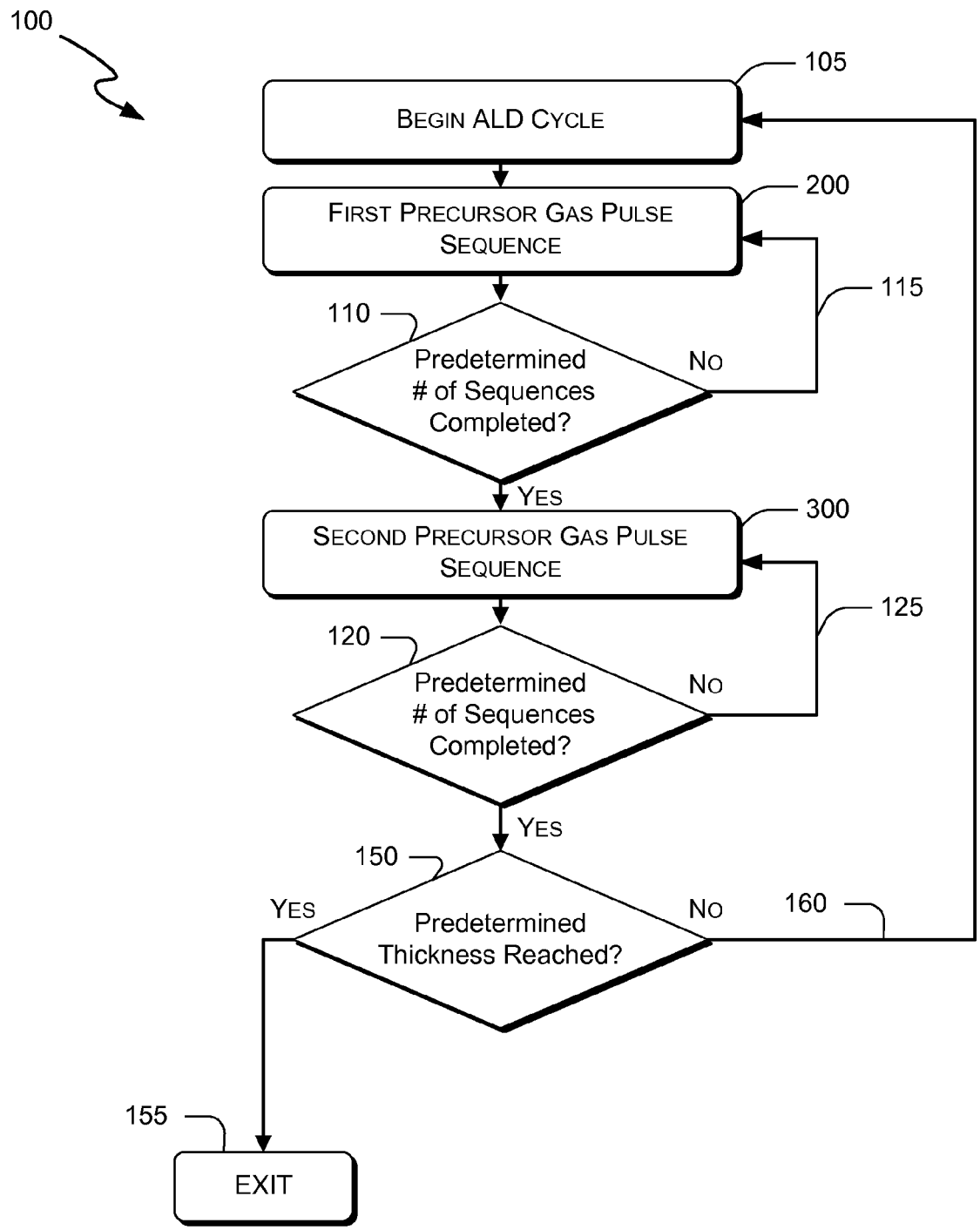
FIG. 1 illustrates a process flow for an embodiment of the present invention.

In FIG. 1, a flow chart depicts a process 100 as described in one embodiment herein. At the beginning 105 of the process 100, a substrate is located within a reaction chamber, and heated to a predetermined temperature. The predetermined temperature may comprise any desired temperature, and embodiments of the present invention may include temperatures such as about 130° C. to 300° C., or from about 135° C. to 145° C., or in one embodiment, about 140° C. During execution of the process 100, the reaction chamber is maintained at any desired pressure range such as from about 1 mTorr to about 200 Torr, and in an embodiment of the present invention from about 2 Torr to 6 Torr, and in another embodiment, from about 3 Torr to 4 Torr, and in yet another preferred embodiment the reaction chamber pressure is maintained at about 3.5 Torr.

A carrier gas may be continually or intermittently admitted into the reactor chamber, and may be utilized to distribute precursor products, reaction products, and oxidation products or to purge remaining gasses or reaction byproducts from the reaction chamber. Suitable carrier gases or purge gases may include argon, nitrogen, helium, hydrogen, forming gas, or combinations thereof.

After the ALD process is initiated 105, a first precursor gas pulse sequence 200 is begun. This process, also shown in FIG. 2, starts by pulsing 210 a first precursor gas into the reaction chamber with or without a carrier gas. The first precursor may comprise any desirable ALD precursor compound, such as tetrakis(ethylmethylamino) hafnium (TEMAHf) or Lanthanum tris-formamidinate La(FAMD)$_3$. The first precursor may in a preferred embodiment comprise a hafnium precursor, such as a hafnium halide (e.g., HfCl$_4$) or an alternate hafnium amino compound such as tetrakis (diethylamino) hafnium ((Et$_2$N)$_4$Hf or TDEAH), tetrakis (dimethylamino) hafnium ((Me$_2$N)$_4$Hf or TDMAH). In a preferred embodiment, the first precursor gas comprises TEMAHf.

During the gas pulses as referred to herein, the substrate in the reaction chamber is exposed to the admitted gas for a predetermined period of time, and this period of time is herein referred to as a pulse interval. The pulse interval for the presentation of the first precursor to the substrate may be predetermined to be any desired time, and for example may include a time in the range of approximately 300 milliseconds to 5 seconds, and in one embodiment the pulse interval is in the range of 1 second to 2 seconds.

After the substrate has been exposed to the first precursor for a predetermined first pulse interval 210, the first precursor is purged 215 from the reaction chamber by admission of a purge gas or by evacuation or pumping. Purging time, or the time during which a purging gas is admitted to the reaction chamber to displace and/or remove other gasses or reaction products, may be selected to be any desired time such as approximately 3 to 10 seconds, and may in some embodiments be approximately 500 milliseconds to 5 seconds.

Figure 2:
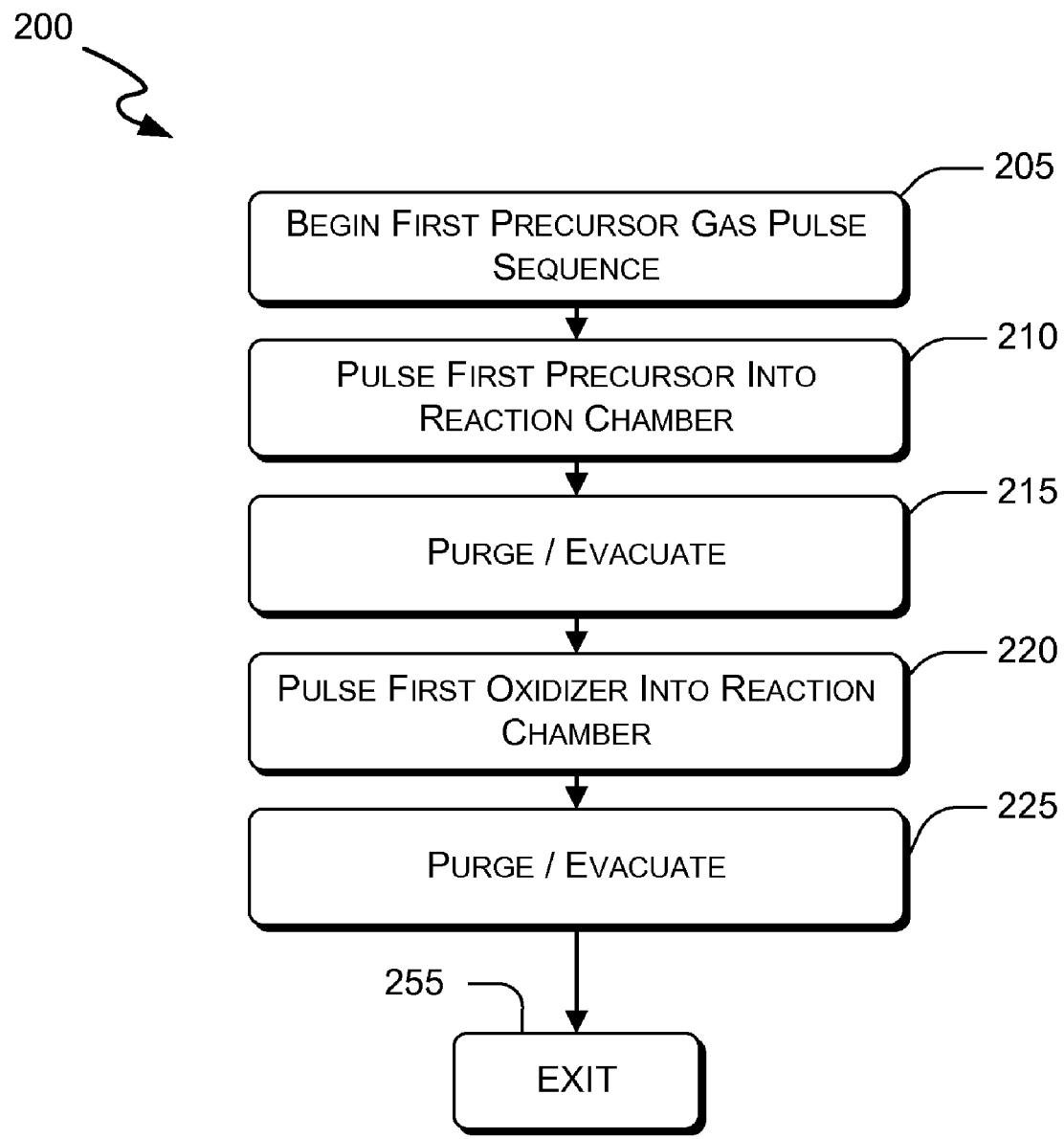
FIG. 2 illustrates a process flow for a first precursor gas sequence of the present invention.

Referring to FIG. 2, an oxidizer/oxidant is admitted 220 into the reaction chamber to react with the first precursor on the substrate. As mentioned previously, any desired oxidizing gas may be used in any oxidant/oxidizer step in the present ALD process, and such oxidizing gas may include oxygen (O$_2$), ozone (O$_3$), atomic-oxygen (O), water (H$_2$O), hydrogen peroxide (H$_2$O$_2$), nitrous oxide (N$_2$O), nitric oxide (NO), dinitrogen pentoxide (N$_2$O$_5$), nitrogen dioxide (NO$_2$), derivatives thereof or combinations thereof. In a preferred embodiment, the oxidizing gas is an ozone/oxygen (O$_3$/O$_2$) mixture, such that the ozone is at a concentration within a range from about 10 atomic percent O$_3$ of the O$_3$/O$_2$ mixture to about 20 atomic percent O$_3$. In an alternate preferred embodiment, the oxidizing gas is an ozone/oxygen (O$_3$/O$_2$) mixture, such that the ozone is at a concentration within a range from about 12 atomic percent O$_3$ of the O$_3$/O$_2$ mixture to about 18 atomic percent O$_3$. In one embodiment of the oxidizer/oxidant step 220, gasses are introduced with approximately 2.5 slm O$_2$ with a carrier gas (such as N$_2$) at 5 sccm, with a total 1250 sccm injection flow.

The oxidant gas is exposed 220 to the substrate for a predetermined first oxidation pulse interval, and the duration thereof may be any appropriate time range such as approximately 50 milliseconds to 10 seconds, and in another embodiment, the first oxidation pulse interval is in the range of 50 milliseconds to 2 seconds. The first oxidant is then purged 225 from the reaction chamber by admission of a purge gas or by evacuation or pumping. Purging time may be selected to be any suitable time such as approximately 3-10 seconds, and may in some embodiments be approximately 500 milliseconds. In various embodiments of the present invention, the first precursor gas sequence may be executed in a total sequence period ranging from 3.1 seconds to 13.1 seconds.

Various advantages may be obtained by using pulse intervals set forth in embodiments of the present invention. For example, embodiments of the present invention use short oxidation pulse intervals to reduce or eliminate the likelihood that the film-substrate interface is penetrated by the oxidant. When oxidants such as ozone are sufficiently exposed to the substrate to allow penetration of the film-substrate interface, interfacial oxides may form and may adversely affect the dielectric constant of the deposited film. By avoiding long oxidant exposure times and thereby reducing creation of interfacial oxides, embodiments of the present invention provide improved techniques to obtain desired dielectric performance characteristics of the deposited film.

Once the first oxidant has been purged from the reaction chamber 255, the process 100 of FIG. 1 continues, wherein a determination is made 110 whether to repeat 115 the first precursor gas pulse sequence 200. Such a determination may be made based on any desired criteria. For example, it may be based upon the number of first precursor gas pulse sequences required to achieve a particular concentration of a deposited substance on the substrate such as hafnium (Hf) or hafnium oxide (HfO$_2$). The determination may also be made to achieve a desired ratio of first precursor sequences 200 to subsequent precursor sequences 300 to further tune the composition of the substance deposited in the film on the substrate. Higher concentration of hafnium may be desired in a hafnium-lanthanum oxide deposition, and therefore more hafnium-depositing precursor sequences may be performed than lanthanum-depositing precursor sequences. The ratio of first precursor sequences to second precursor sequences may also be tailored to achieve a particular performance characteristic of the deposited film such as a desired dielectric constant that may be adjusted depending on the proportion of exposure of the substrate of first precursor compared to the second precursor.

If more first precursor gas pulse sequences are required, the process iterates 115 until the predetermined number of first precursor gas sequences has been reached.

Figure 3:
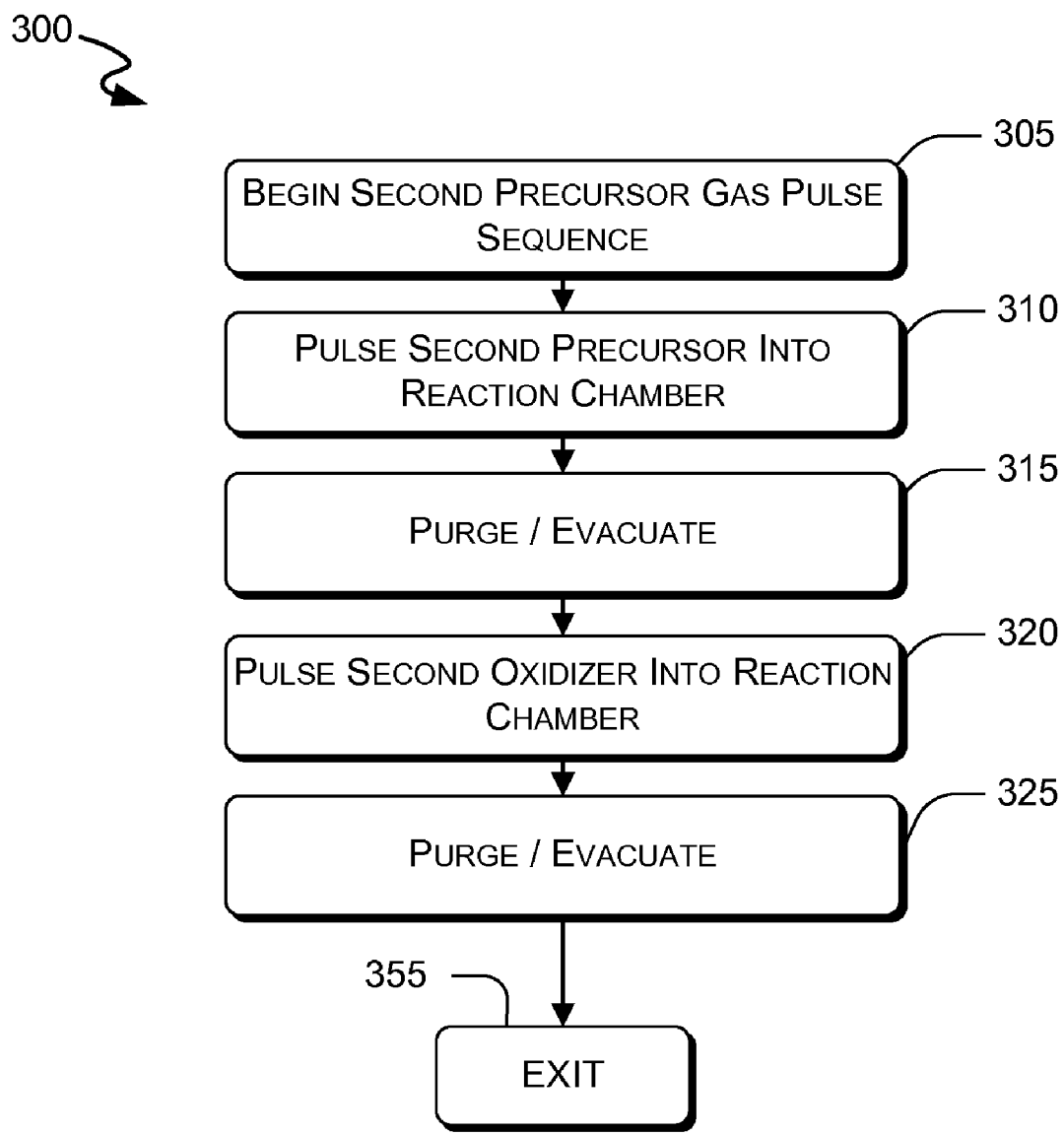
FIG. 3 illustrates a process flow for a first precursor gas sequence of the present invention.

After the necessary first precursor gas pulse sequences 200 have been performed, a second precursor gas pulse sequence 300 is begun. Referring to FIG. 3, the second precursor gas pulse sequence starts 305 by pulsing 310 a first precursor gas into the reaction chamber with or without a carrier gas. The second precursor may comprise any desirable ALD precursor compound, such as tetrakis-ethyl-methylamino hafnium (TEMAHf) or lanthanum tris-formamidinate La(FAMD)$_3$. In one embodiment, the second precursor comprises La(THD)$_3$ (THD=2,2,6,6-tetramethyl-3,5-heptanedione), and in another embodiment, the second precursor gas comprises La(FAMD)$_3$. The pulse interval for the exposure of the second precursor to the substrate may be predetermined to be any desired time, and for example may include a time in the range of approximately 500 milliseconds to 10 seconds, and in one embodiment the pulse interval is in the range of 1 second to 4 seconds.

After the substrate has been exposed to the second precursor for a predetermined second pulse interval 310, the second precursor is purged 315 from the reaction chamber by admission of a purge gas or by evacuation or pumping out the second precursor. As explained above, purging time may be selected to be any suitable time such as approximately 3-10 seconds, and may in some embodiments be approximately 500 milliseconds.

Referring to FIG. 3, an oxidizer/oxidant is admitted 320 into the reaction chamber to react with the first precursor on the substrate. As mentioned previously, any desired oxidizing gas may be used in any oxidant/oxidizer step in the present ALD process, and such oxidizing gas may include oxygen ($O_2$), ozone ($O_3$), atomic-oxygen (O), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), or combinations thereof. In a preferred embodiment, the oxidizing gas is an ozone/oxygen ($O_3/O_2$) mixture, such that the ozone is at a concentration within a range from about 10 atomic percent $O_3$ of the $O_3/O_2$ mixture to about 20 atomic percent $O_3$. In an alternate preferred embodiment, the oxidizing gas is an ozone/oxygen ($O_3/O_2$) mixture, such that the ozone is at a concentration within a range from about 12 atomic percent $O_3$ of the $O_3/O_2$ mixture to about 18 atomic percent $O_3$. In one embodiment of the oxidizer/oxidant step 320, gasses are introduced with approximately 2.5 slm $O_2$ with a carrier gas (such as $N_2$) at 5 sccm, with a total 1250 sccm injection flow.

The oxidant gas is exposed 320 to the substrate for a predetermined second oxidation pulse interval, and the duration thereof may be any appropriate time range such as approximately 50 milliseconds to 10 seconds, and in another embodiment, the second oxidation pulse interval is in the range of 50 milliseconds to 2 seconds. The second oxidant is then purged 325 from the reaction chamber by admission of a purge gas or by evacuation or pumping. Purging time may be selected to be any suitable time such as approximately 3-10 seconds, and may in some embodiments be approximately 500 milliseconds.

Once the second oxidant has been purged from the reaction chamber 355, the process 100 of FIG. 1 continues, wherein a determination is made 120 whether to repeat 125 the second precursor gas pulse sequence 300. Such a determination may be made at any time (including prior to the initial pulsing) and be based on any suitable criteria. For example, it may be based upon a predetermined number of first precursor gas pulse sequences to achieve a particular concentration of a deposited substance on the substrate such as lanthanum (La) or hafnium oxide ($HfO_2$). As mentioned previously, the determination may also be made to achieve a desired ratio of first precursor sequences 200 to subsequent precursor sequences 300 to further tune the composition of the substance deposited in the film on the substrate. Iteration 125 is undertaken as desired to complete the determined number of second precursor gas sequences 300.

After determination 120 that no further second precursor sequences 300 are required for the present ALD cycle (steps 105, 200, 110, 300, 120, 150), a determination is made whether an additional ALD cycle is required. The determination may be made at any time (including prior to the initial pulsing) and be based on any suitable criteria, such as measured, observed, or desired deposition performance criteria. It may also be made based on a predetermined number of ALD cycles required to achieve a particular film thickness. Each ALD cycle forms a layer of material (e.g., HfLaO) on the substrate, and each layer is often deposited in a predictable thickness, for instance about 2.5 Å per ALD cycle for embodiments of the present invention. For example, if a final layer thickness of 300 Å is desired, and if one complete ALD cycle deposits a 2.5 Å layer, then the ALD cycle is iterated 160 one hundred twenty times to produce the desired final layer thickness.

ALD cycle time throughput of embodiments of the present invention are substantially improved over the prior art. For example, in an embodiment of the present invention as described above using TEMAHf during the first precursor sequence and La(FAMD)$_3$ in the second precursor sequence, a typical cycle time for a 1:1 sequence ratio (one first precursor sequence to one second precursor sequence) results in an approximately 20.2 second cycle time, which may be further reduced in various embodiments of the present invention.

Figure 4:
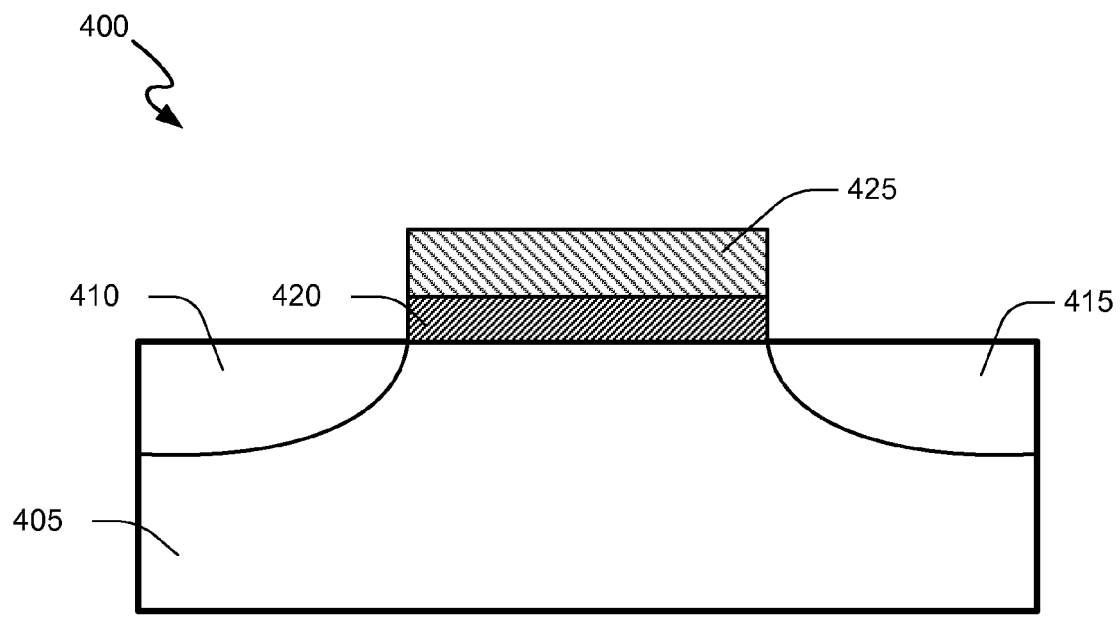
FIG. 4 depicts a metal oxide transistor with a dielectric layer formed by methods consistent with the present invention.

FIG. 4 illustrates a single metal oxide (MOS) transistor 400 fabricated with an embodiment of a method of the present invention to form a dielectric layer 420 containing an ALD-deposited HfLaO gate insulator layer. The use of high-k dielectrics such as HfLaO provides for fabrication of increasingly smaller transistors that have improved leakage currents and other characteristics such compared with traditional silicon oxide-type dielectrics. A substrate 405 is prepared for deposition, typically a silicon or silicon-containing material. As described above in relation to substrate types, however, other semiconductor materials such as germanium, gallium arsenide, and silicon-on-sapphire substrates may also be used. Prior to depositing a gate dielectric 420, various layers within the substrate 405 of the transistor are formed and various regions of the substrate are prepared, such as the drain diffusion 410 and source diffusion 415 of the transistor 400. The substrate 405 is typically cleaned to provide an initial substrate depleted of its native oxide. The substrate may also be cleaned to provide a hydrogen-terminated surface to improve the rate of chemisorption. The sequencing of the formation of the regions of the transistor being processed may follow typical sequencing that is generally performed in the fabrication of a MOS transistor, as is known to those skilled in the art.

In various embodiments, the dielectric 420 covering the area on the substrate 405 between the source and drain diffused regions 415 and 410 is deposited by the ALD process described in accordance with FIG. 1 of the present invention, and comprises a layer of HfLaO in molecular proportion that is determined by a ratio of first precursor gas sequences 200 to second precursor gas sequences 300. The single dielectric layer 420 shown is merely one embodiment, and may in other embodiments also include additional layers of HfLaO or other suitable dielectrics or barrier materials.

The transistor 400 has a conductive material forming a single gate electrode 425 over the gate dielectric 420. Typically, forming the gate 425 may include forming a polysilicon layer, though a metal gate may be formed in an alternative process. Fabricating the substrate 405, the source and drain regions 415 410, and the gate 425, is performed by using standard processes known to those skilled in the art. Additionally, the sequencing of the various elements of the process for forming a transistor is conducted with standard fabrication processes, also as known to those skilled in the art.

In the illustrated embodiment, the dielectric layer 420 is shown as being the first layer and in direct contact with the substrate 405; however, the invention is not so limited. In various embodiments, a diffusion barrier layer may be inserted between the dielectric layer 420 and the substrate 405 to prevent metal contamination from affecting the electrical properties of the device. The transistor 400 shown in FIG. 4 has a conductive material forming a single gate electrode 425, but the gate dielectric may also be used in a floating gate device such as flash memory as depicted in FIG. 5.

Figure 5:
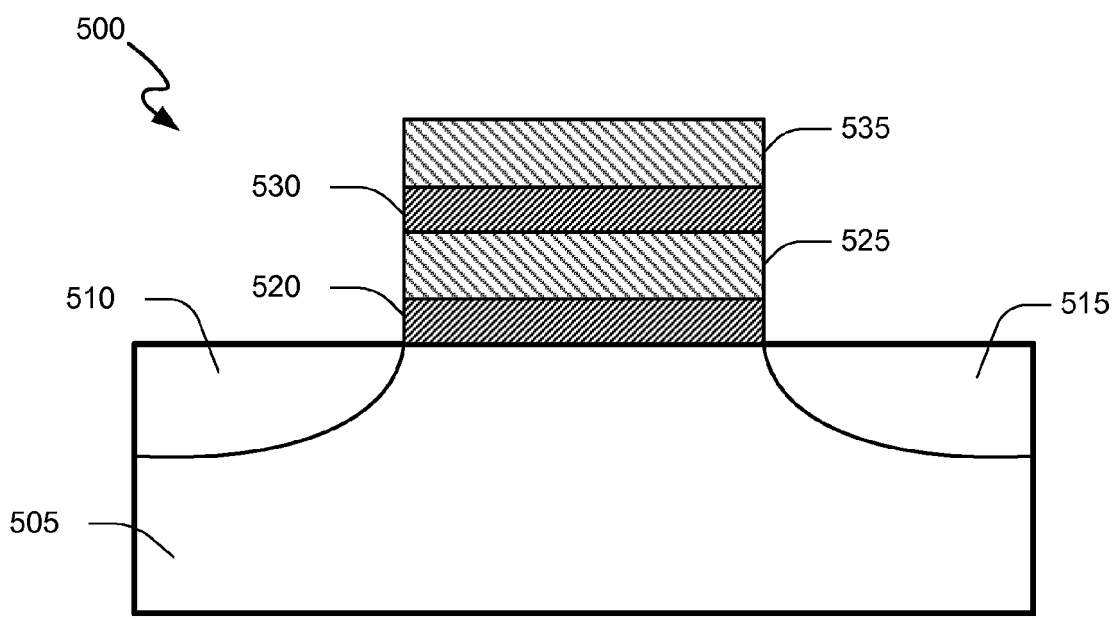
FIG. 5 shows a memory cell with at least one dielectric layer formed by methods consistent with the present invention.

FIG. 5 illustrates a single memory cell 500 fabricated according to one embodiment of the present invention. In this embodiment, the memory cell 500 is a floating gate memory cell appropriate for use in FLASH or other memory devices. Similar to the transistor 400 shown in FIG. 4, the memory cell 500 includes a substrate 505 (usually silicon but may be other substrates as described herein) in which a source region 515 and a drain region 510 are formed. Typically, memory cell 500 also includes a first dielectric layer 520 (which may be referred to as a tunnel layer), a storage element or floating gate 525 (formed of conductive material such as polysilicon), a second dielectric layer 525, and a control gate 535 (also formed of conductive material such as polysilicon).

Similarly to the transistor 400 described in relation to FIG. 4, the memory cell 500 is fabricated with an embodiment of a method of the present invention to form either or both dielectric layers 520, 530. Dielectric layers 520, 530 may be fabricated in whole or in part by using an ALD-deposited HfLaO gate insulator layer that is formed by methods in accordance with the present invention. The substrate 505 is prepared for deposition, typically a silicon or silicon-containing material. As described above in relation to substrate types, however, other semiconductor materials such as germanium, gallium arsenide, and silicon-on-sapphire substrates may also be used. Prior to depositing the dielectric 520, various layers within the substrate 505 of the transistor are formed and various regions of the substrate are prepared, such as the drain diffusion 510 and source diffusion 515 of the memory cell 500. The substrate 505 is typically cleaned to provide an initial substrate depleted of its native oxide. The substrate may also be cleaned to provide a hydrogen-terminated surface to improve the rate of chemisorption. The sequencing of the formation of the regions of the transistor being processed may follow typical sequencing that is generally performed in the fabrication of a MOS transistor, as is well known to those skilled in the art.

In various embodiments, the dielectric 520 covering the area on the substrate 505 between the source and drain diffused regions 515 and 510 is deposited by the ALD process described in accordance with FIG. 1 of the present invention, and comprises a layer of HfLaO in molecular proportion deposited by a predetermined ratio of first precursor gas sequences 200 to second precursor gas sequences 300. The dielectric layers shown 520, 530 may in other embodiments also include additional layers of HfLaO or other suitable dielectrics or barrier materials.

The memory cell 500 has conductive materials forming a control gate electrode 535 and floating gate 525 in a region over the dielectric 520. Typically, forming the gates 525, 535 may include forming polysilicon layers, though metal gates may be formed in an alternative process. The process to fabricate the substrate 505, the source and drain regions 515 510, and the gate 525, 535 is performed using standard processes known to those skilled in the art. Additionally, the sequencing of the various elements of the process for forming a memory cell is conducted with standard fabrication processes, which are also known to those skilled in the art.

In the illustrated embodiment, the dielectric layers 520, 530 are shown as being in direct contact with the substrate 505, the floating gate 525, and the control gate 535. In other embodiments, diffusion barrier layers may be inserted between the dielectric layers 520, 530 and/or the substrate 505, the floating gate 525, and the control gate 535 to prevent metal contamination from affecting the electrical properties of the memory cell 500.

The embodiments of methods for forming HfLaO dielectric layers may also be applied to methods to fabricate capacitors in various integrated circuits, memory devices, and electronic systems. In an embodiment for fabricating a capacitor, a method includes forming a first conductive layer, forming a dielectric layer containing HfLaO on the first conductive layer by embodiments of the ALD cycle described herein, and forming a second conductive layer on the dielectric layer. ALD formation of the HfLaO dielectric layer allows the dielectric layer to be engineered within a predetermined composition providing a desired dielectric constant and/or other controllable characteristics.

Figure 6:
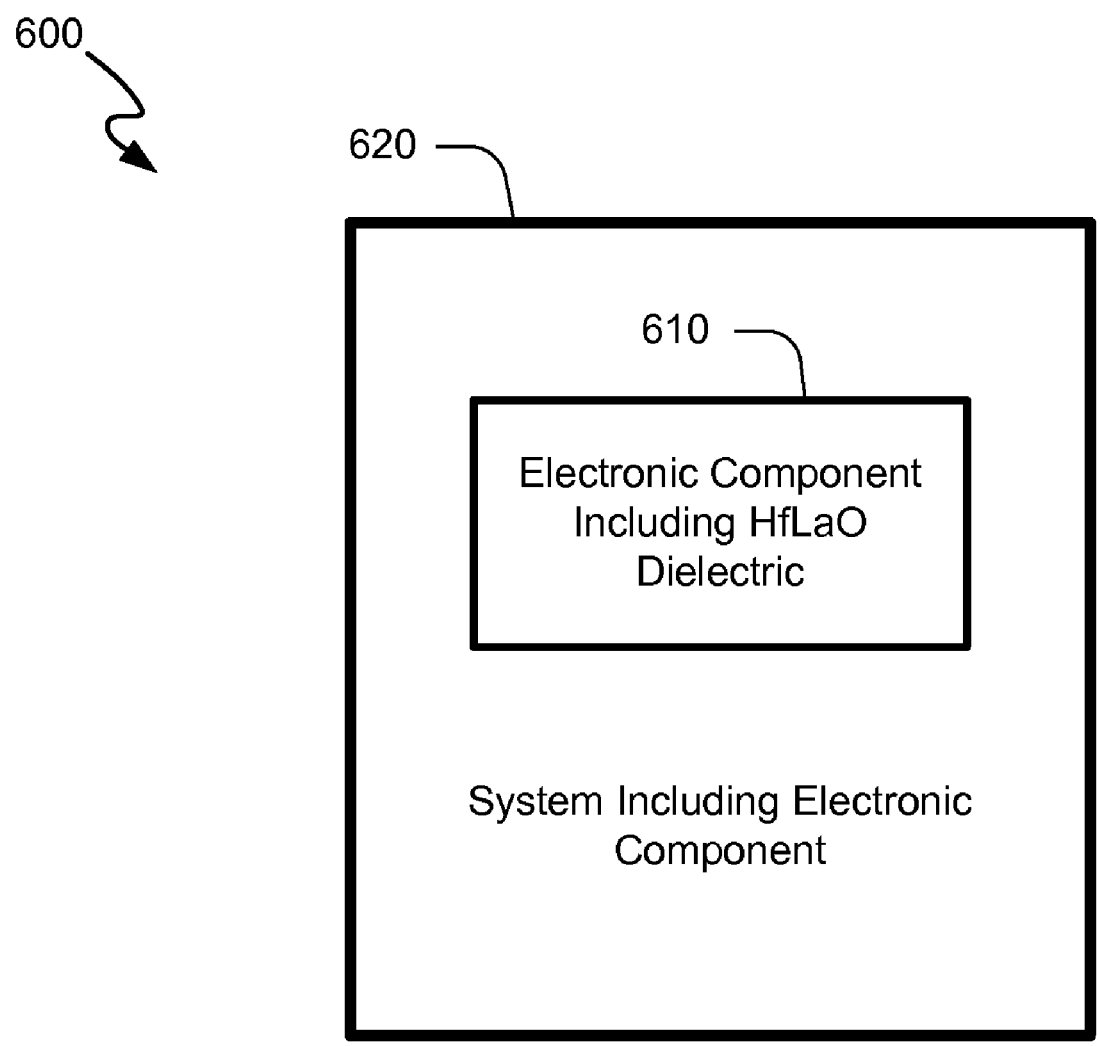
FIG. 6 illustrates a general system incorporating an electronic component that includes a dielectric layer formed by methods consistent with the present invention.
Figure 7:
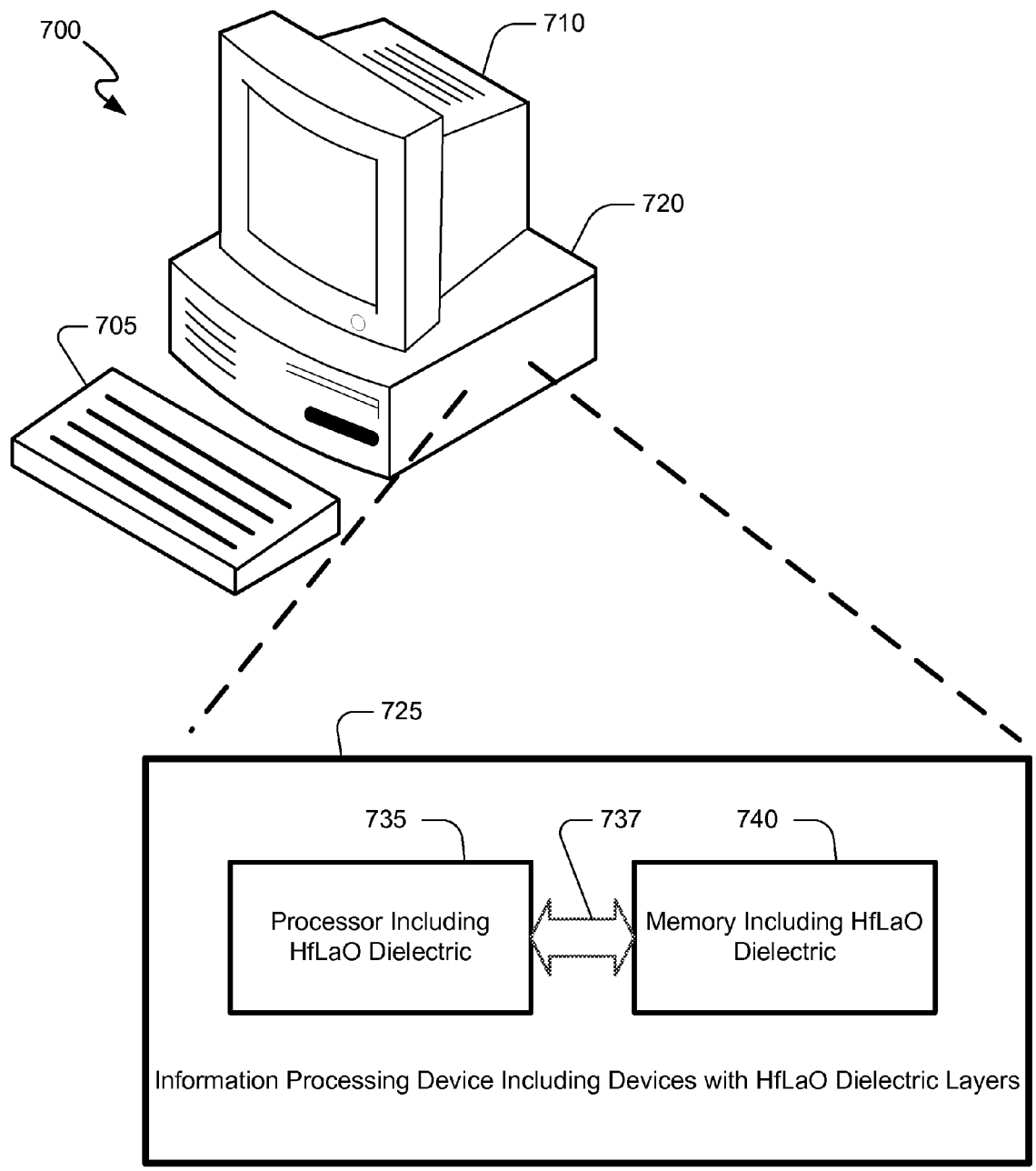
FIG. 7 shows an information processing device such as a computer that incorporates electronic components including a dielectric layer formed by methods consistent with the present invention

Electronic components such as transistors, capacitors, and other devices having dielectric layers fabricated by embodiments of the present invention described herein may be implemented into memory devices, processors, and electronic systems. Generally, as depicted in FIG. 6, such electronic components 610 may be incorporated into systems 620 such as information processing devices. Such information processing devices may include wireless systems, telecommunication systems, mobile subscriber units such as cellular phones and smart phones, personal digital assistants (PDAs), and computers. An embodiment of a computer having a dielectric layer, such as an HfLaO dielectric layer, formed by atomic layer deposition using methods described herein is shown in FIG. 7 and described below. While specific types of memory devices and computing devices are shown below, it will be recognized by one skilled in the art that several types of memory devices and electronic systems including information handling devices utilize the present subject matter.

A personal computer 700, as shown in FIG. 7, may include an output device such as screen or monitor 710, keyboard input device 705 and a central processing unit 720. Central processing unit 720 typically may include circuitry 725 that utilizes a processor 735, and a memory bus circuit 737 coupling one or more memory devices 740 to the processor 735. The processor 735 and/or memory 740 of the personal computer 700 also includes at least one transistor or memory cell having a dielectric layer, such as an HfLaO dielectric layer, formed by atomic layer deposition using methods described herein according an embodiment of the present subject matter. Those of skill in the art are aware that other electronic components in the computer 700 may utilize a dielectric layer, such as an HfLaO dielectric layer, formed by atomic layer deposition using methods described herein. Such components may include many types of integrated circuits including processor chip sets, video controllers, memory controllers, I/O handlers, BIOS memory, FLASH memory, audio and video processing chips, and the like. Those of skill in the art also appreciate that other information handling devices such as personal digital assistants (PDAs) and mobile communication devices such as cell phones and smart phones may incorporate dielectric layers that are formed by using embodiments of the present invention.

Other embodiments of the invention will be apparent to those skilled in the art from consideration of the specification and embodiments disclosed herein. Thus, the specification and examples are exemplary only, with the true scope and spirit of the invention set forth in the following claims and legal equivalents thereof.

What is claimed is:

1. A method for depositing a film on a substrate that is within a reaction chamber, the method comprising applying an atomic layer deposition cycle to the substrate, the cycle comprising:
   exposing the substrate to a first precursor gas pulse sequence, wherein the first precursor gas sequence includes:
      exposing the substrate to a first precursor gas for a first precursor pulse interval then removing the first precursor gas thereafter; and
      exposing the substrate to a first oxidant gas for a first oxidation pulse interval then removing the first oxidation gas thereafter;
   exposing the substrate to a second precursor gas pulse sequence, wherein the second sequence includes:
      exposing the substrate to a second precursor gas for a second precursor pulse interval then removing the second precursor gas thereafter; and exposing the substrate to a second oxidant gas for a second oxidation pulse interval then removing the second oxidation gas thereafter;

wherein the first precursor gas comprises at least one of tetrakis-ethyl-methylamino hafnium (TEMAHf) and lanthanum tris-formamidinate (LaFAMD)$_3$.

2. The method of claim 1 wherein the second precursor gas comprises at least one of tetrakis-ethyl-methylamino hafnium (TEMAHf) and lanthanum tris-formamidinate (LaFAMD)$_3$.

3. The method of claim 1 wherein the first precursor gas comprises TEMAHf and the second precursor gas comprises (LaFAMD)$_3$.

4. The method of claim 1 wherein the first oxidant gas and the second oxidant gas comprise one or more of the group selected from O, $O_2$, $O_3$, $H_2O$, $H_2O_2$, NO, $N_2O$, $N_2O_5$ and $NO_2$.

5. The method of claim 2 wherein each of the first oxidant gas and the second oxidant gas comprises $O_2$ and $O_3$.

6. The method of claim 5 wherein each of the first oxidant gas and the second oxidant gas comprises approximately 10 atomic percent to 20 atomic percent $O_3$.

7. The method of claim 5 wherein each of the first oxidant gas and the second oxidant gas comprises approximately 12 atomic percent to 18 atomic percent $O_3$.

8. The method of claim 1 further comprising repeating the atomic layer deposition cycle until the deposited film has reached a predetermined thickness.

9. The method of claim 1 further comprising in any atomic layer deposition cycle:
performing the first precursor gas pulse sequence a predetermined number of n iterations; and
performing the second precursor gas pulse sequence a predetermined number of m iterations, wherein the ratio of n:m is 1:1.

10. The method of claim 9 wherein the ratio if n:m is greater than 1.

11. The method of claim 9 wherein the ratio if n:m is less than 1.

12. The method of claim 9 wherein the n iterations of the first precursor gas sequence are performed before the m iterations of the second precursor gas sequence.

13. The method of claim 9 wherein the number of n iterations and the number of m iterations are determined by at least one of:
a dielectric constant of the deposited film;
an index of refraction of the deposited film;
a molecular composition of the deposited film; and
a ratio of atomic hafnium to atomic lanthanum to be deposited in the deposited film.

14. The method of claim 1 wherein:
the first precursor pulse interval is in the range of 300 milliseconds to 5 seconds;
the first oxidation pulse interval is in the range of 50 milliseconds to 10 seconds;
the second precursor pulse interval is in the range of 500 ms to 10 seconds; and
the first oxidation pulse interval is in the range of 50 milliseconds to 10 seconds.

15. The method of claim 1 wherein:
the first precursor pulse interval is in the range of 1 second to 2 seconds;
the first oxidation pulse interval is in the range of 50 milliseconds to 2 seconds;
the second precursor pulse interval is in the range of 1 second to 4 seconds; and
the first oxidation pulse interval is in the range of 50 milliseconds to 2 seconds.

16. The method of claim 1 wherein the first precursor gas sequence deposits a first sequence film on the substrate wherein the first sequence film is deposited with a thickness between 0.8-1.1 Å per first precursor gas sequence.

17. The method of claim 1 wherein the second precursor gas sequence deposits a second sequence film on the substrate wherein the second sequence film is deposited with a thickness between 0.6-0.8 Å per second precursor gas sequence.

18. The method of claim 1 wherein the film deposited by the atomic layer deposition cycle deposits the film with a thickness between 1.4-2.7 Å per deposition cycle.

19. The method of claim 1 wherein during the atomic layer deposition cycle, the substrate is maintained at a temperature in the range of 140° C. to 300° C.

20. The method of claim 1 wherein during the atomic layer deposition cycle, the substrate is maintained at a temperature in the range of 175° C. to 250° C.

21. The method of claim 1 wherein during the atomic layer deposition cycle, a vessel temperature of at least one of the first precursor gas and the second precursor gas is maintained at a temperature in the range of 135° C. to 145° C.

22. The method of claim 1 wherein removing the first precursor gas, removing the first oxidation gas, removing the second precursor gas and removing the second oxidation gas comprises at least one of:
evacuating gas from the reaction chamber for a predetermined evacuation period; and
introducing a purge gas into the reaction chamber for a purge period, wherein:
the purge gas comprises one or more of the group consisting of: argon, nitrogen, helium, hydrogen, forming gas, krypton, and xenon; and
the purge period is in the range of approximately 500 milliseconds to 10 seconds.

23. The method of claim 22 wherein the purge period is in the range of approximately 500 milliseconds to 4 seconds.

24. The method of claim 22 wherein the purge period is in the range of approximately 3 seconds to 10 seconds.

25. A method for depositing a film on a substrate that is within a reaction chamber, the method comprising applying an atomic layer deposition cycle to the substrate, the cycle comprising:
exposing the substrate to a first precursor gas pulse sequence, wherein the first sequence includes:
exposing the substrate to a first precursor gas comprising tetrakis-ethyl-methylamino hafnium (TEMAHf) for a first precursor pulse interval;
removing the first precursor gas by introducing a purge gas into the reaction chamber for a first precursor purge period;
exposing the substrate to a first oxidant gas for a first oxidation pulse interval; and
removing the first oxidant gas by introducing the purge gas into the reaction chamber for a first oxidant purge period;
exposing the substrate to a second precursor gas pulse sequence, wherein the first sequence includes:
exposing the substrate to a second precursor gas comprising Lanthanum tris-formamidinate (LaFAMD)$_3$ for a second precursor pulse interval;
removing the first precursor gas by introducing the purge gas into the reaction chamber for a second precursor purge period;
exposing the substrate to a second oxidant gas for a second oxidation pulse interval; and removing the second oxidant gas by introducing the purge gas into the reaction chamber for a second oxidant purge period.

26. The method of claim 25 wherein each of the first oxidant gas and the second oxidant gas comprises a mixture of $O_2$ and $O_3$, and wherein the mixture comprises approximately 10 atomic percent to 18 atomic percent $O_3$.

27. The method of claim 25 further comprising repeating the atomic layer deposition cycle until the deposited film has reached a predetermined thickness.

28. The method of claim 25 further comprising repeating the first precursor gas pulse sequence a plurality of times before exposing the substrate to the second precursor gas sequence.

29. The method of claim 25 wherein:
the first precursor pulse interval is in the range of about 1 second to 2 seconds;
the first oxidation pulse interval is in the range of 50 milliseconds to 2 seconds;
the second precursor pulse interval is in the range of 1 second to 4 seconds; and
the first oxidation pulse interval is in the range of 50 milliseconds to 2 seconds.

30. The method of claim 25 wherein during the atomic layer deposition cycle, the substrate is maintained at a temperature in the range of 175° C. to 250° C.

31. The method of claim 25 wherein during the atomic layer deposition cycle, a vessel temperature of a vessel holding at least one of the first precursor gas and the second precursor gas is maintained at a temperature in the range of 135° C. to 145° C.

32. An electronic device comprising a HfLaO dielectric layer and a conductive layer in communication with the dielectric layer, the dielectric layer deposited in a film by applying an atomic layer deposition cycle according to claim 1 to the substrate.

33. The electronic device of claim 32 wherein the first oxidant gas and the second oxidant gas comprise a mixture of $O_2$ and $O_3$, and wherein the mixture comprises approximately 12 atomic percent to 18 atomic percent $O_3$.

34. The electronic device of claim 32 further comprising repeating the atomic layer deposition cycle until the dielectric layer has reached a predetermined thickness.

35. The electronic device of claim 32 further comprising repeating the first precursor gas pulse sequence a plurality of times before exposing the substrate to the second precursor gas sequence.

36. The electronic device of claim 32 wherein:
the first precursor pulse interval is in the range of 1 second to 2 seconds;
the first oxidation pulse interval is in the range of 50 milliseconds to 2 seconds;
the second precursor pulse interval is in the range of 1 second to 4 seconds; and
the first oxidation pulse interval is in the range of 50 milliseconds to 2 seconds.

37. The electronic device of claim 32 wherein during the atomic layer deposition cycle, the substrate is maintained at a temperature in the range of 175° C. to 250° C.

38. The electronic device of claim 32 a vessel temperature of a vessel holding at least one of the first precursor gas and the second precursor gas is maintained at a temperature in the range of 135° C. to 145° C.

39. The electronic device of claim 32 wherein the electronic device comprises at least one of a capacitor, a transistor, a FLASH memory cell, and a DRAM memory cell.

40. An electronic system comprising:
a processor;
a memory device coupled to the processor, wherein the memory device includes a plurality of transistors, wherein the transistors include an HfLaO dielectric layer and a conductive layer in communication with the dielectric layer, the dielectric layer deposited in a film by applying an atomic layer deposition cycle according to claim 1 to the substrate.

41. The electronic device of claim 40 wherein the first oxidant gas and the second oxidant gas comprise a mixture of $O_2$ and $O_3$, and wherein the mixture comprises approximately 12 atomic percent to 18 atomic percent $O_3$.

42. The electronic device of claim 40 further comprising repeating the atomic layer deposition cycle until the dielectric layer has reached a predetermined thickness.

43. The electronic device of claim 40 further comprising repeating the first precursor gas pulse sequence a predetermined plurality of times before exposing the substrate to the second precursor gas sequence.

44. The electronic device of claim 40 wherein:
the first precursor pulse interval is in the range of 1 second to 2 seconds;
the first oxidation pulse interval is in the range of 50 milliseconds to 2 seconds;
the second precursor pulse interval is in the range of 1 second to 4 seconds; and
the first oxidation pulse interval is in the range of 50 milliseconds to 2 seconds.

45. The electronic device of claim 40 wherein during the atomic layer deposition cycle, the substrate is maintained at a temperature in the range of 175° C. to 250° C.

46. The electronic device of claim 40 a vessel temperature of a vessel holding at least one of the first precursor gas and the second precursor gas is maintained at a temperature in the range of 135° C. to 145° C.

47. The electronic device of claim 40 wherein the electronic system comprises at least one of a computer, a mobile subscriber unit such as a cellular telephone or smart phone, and a PDA.

* * * * *